United States Patent
Haskal et al.

(10) Patent No.: US 8,697,503 B2
(45) Date of Patent: Apr. 15, 2014

(54) ACTIVE MATRIX DISPLAYS AND OTHER ELECTRONIC DEVICES HAVING PLASTIC SUBSTRATES

(75) Inventors: Eliav Itzhak Haskal, Eindhoven (NL); David James McCulloch, Eindhoven (NL); Dirk Jan Broer, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 631 days.

(21) Appl. No.: 12/376,980

(22) PCT Filed: Aug. 7, 2007

(86) PCT No.: PCT/IB2007/053120
§ 371 (c)(1),
(2), (4) Date: Feb. 10, 2009

(87) PCT Pub. No.: WO2008/018026
PCT Pub. Date: Feb. 14, 2008

(65) Prior Publication Data
US 2010/0163878 A1 Jul. 1, 2010

(30) Foreign Application Priority Data
Aug. 10, 2006 (EP) .................... 06118726

(51) Int. Cl.
*H01L 21/00* (2006.01)
*H01L 21/84* (2006.01)

(52) U.S. Cl.
USPC ........... 438/153; 438/149; 438/458; 438/473; 438/476; 257/E21.499; 257/E33.044

(58) Field of Classification Search
USPC .......... 438/149, 458, 473, 476; 257/E21.499, 257/E33.004
See application file for complete search history.

(56) References Cited

U.S. PATENT DOCUMENTS

| 4,544,583 A * | 10/1985 | Claussen et al. ............... 428/1.5 |
| 4,606,998 A | 8/1986 | Clodgo et al. |
| 6,184,968 B1 | 2/2001 | Taylor-Smith |
| 2004/0014265 A1 * | 1/2004 | Kazlas et al. ................. 438/200 |
| 2004/0101618 A1 | 5/2004 | Ottermann et al. |
| 2004/0180997 A1 * | 9/2004 | Pearson et al. .................. 524/99 |
| 2010/0196683 A1 * | 8/2010 | Haskal .......................... 428/212 |

FOREIGN PATENT DOCUMENTS

| JP | 56140322 A | 11/1981 |
| JP | 06308473 A | 11/1994 |
| JP | 07325297 A | 12/1995 |
| JP | 2001331120 A | 11/2001 |
| JP | 2004226739 A | 8/2004 |
| WO | 2005050754 A1 | 6/2005 |
| WO | WO 2005050754 A1 * | 6/2005 |

OTHER PUBLICATIONS

H. Lifka et al, "Ultra-Thin Flexible OLED Device", Philips Research Laboratories, UK, Nov. 28, 2006.

* cited by examiner

*Primary Examiner* — Leonard Chang (57) ABSTRACT

A method of manufacturing a thin film electronic device includes applying a plastic coating to a rigid carrier substrate using a wet casting process, the plastic coating forming a plastic substrate and include a transparent plastic material doped with a UV absorbing additive. Thin film electronic elements are formed over the plastic substrate, and the rigid carrier substrate is released from the plastic substrate. This method forms transparent substrate materials suitable for a laser release process, through doping of the plastic material of the substrate with a UV absorber. This UV absorber absorbs in the wavelength of the lift-off laser (for example 308-351 nm, or 355 nm) with a very high absorption.

40 Claims, 8 Drawing Sheets

ACTIVE MATRIX DISPLAYS AND OTHER ELECTRONIC DEVICES HAVING PLASTIC SUBSTRATES

FIELD OF THE INVENTION

This invention relates to the manufacture of electronic devices, such as active matrix display devices, on plastic substrates.

BACKGROUND OF THE INVENTION

The most common form of active matrix display is an active matrix liquid crystal display (AMLCD). AMLCD devices are usually made on large glass substrates that are 0.7 mm thick. Two plates are needed for a cell, so that completed displays are just over 1.4 mm thick. Mobile phone manufacturers, and some laptop computer manufacturers, require thinner and lighter displays, and completed cells can be thinned in an HF (hydrofluoric acid) solution, typically to about 0.8 mm thick. Mobile phone manufacturers ideally want the displays to be even thinner, but it has been found that cells below 0.8 mm thick made by this method are too fragile.

The HF thinning is not attractive because it is a wasteful process that uses hazardous chemicals that are difficult to dispose of safely and economically. There is also some yield loss during the etching process due to pitting of the glass.

The attractiveness of light, rugged and thin plastic AMLCDs as an alternative has long been recognized. Recently, interest in plastic displays has increased even further, partly due to the increased use of color AMLCDs in mobile phones and PDAs. There has been much research recently into AMLCDs and organic light emitting diode (OLED) displays on plastic substrates. Despite this interest, there is still a need for a plausible manufacturing route for mass production of plastic displays.

A number of different ways have been reported for the manufacture of thin film transistors (TFTs) or displays on plastic substrates.

One technique is described in WO 05/050754, in which a substrate arrangement is manufactured comprising a rigid carrier substrate and a plastic substrate over the rigid carrier substrate. The rigid carrier substrate is released from the plastic substrate after forming pixel circuits and display cells over the plastic substrate. This enables substantially conventional substrate handling, processing and cell making to be employed. WO 05/050754 also describes other known methods for fabricating electronic devices on plastic substrates.

The release process proposed in WO 05/050754 is a laser lift-off process, and the substrate material is polyimide, applied by spin-coating. One of the advantages of polyimide is its high-temperature stability.

There are, however, several drawbacks to the use of polyimide, particularly that the polyimide is yellowish, and that the spin-coated polyimide material is birefringent.

The implication of both of these drawbacks is that transmissive (transflective) displays cannot be made, nor can polarization-dependent displays be made (such as LCDs) without great difficulty.

There is therefore a need for a transparent substrate material which has high-temperature stability, is transparent, and preferably nonbirefringent. Typical transparent materials such as polycarbonate or silicones do not absorb sufficient UV energy to be lifted off by a laser release process.

OBJECT AND SUMMARY OF THE INVENTION

According to the invention, there is provided a method of manufacturing a thin film electronic device, the method comprising:

applying a plastic coating to a rigid carrier substrate using a wet casting process, the plastic coating forming a plastic substrate and comprising a transparent plastic material and a UV absorbing additive;

forming thin film electronic elements over the plastic substrate; and releasing the rigid carrier substrate from the plastic substrate.

This invention provides a method of making transparent substrate materials suitable for a laser release process, through doping of the plastic material of the substrate with a UV absorber. This UV absorber absorbs in the wavelength of the lift-off laser (for example 308-351 nm, or 355 nm) with a very high absorption coefficient $\mu$ (for example $>10^4$ cm$^{-1}$).

The UV absorber is preferably selected such that it does not contribute to any birefringence in the transparent substrate material, and in this way the transparent substrate can be made non-birefringent.

The plastic is capable of wet casting. The plastic layer can for example be applied to the rigid substrate by a spin-on process, and this plastic substrate then becomes the final device substrate. Alternatively, the plastic can be applied by spreading with a blade or printing techniques such as offset litho or silk screen printing.

The UV absorbing additive may comprise one or more of: 2-(-2H-benzotriazol-2-yl)-4,6-bis(1-menthyl-1-phenyl-ethyl)phenol; stilbene; stilbene with the benzene substituted with electron donating and withdrawing groups; ethyl-p-dimethylamino benzoate; and 2,5-diphenyloxazole.

Preferably, the plastic material is non-birefringent.

The plastic material may comprise polycarbonate or a silicone.

The method may further comprise thermal curing of the plastic coating before forming thin film electronic elements.

UV curing of the plastic coating may be used thereby to draw the UV absorbing additive to the boundary between the rigid carrier and the plastic coating, before forming thin film electronic elements. This can enhance the UV energy absorption at the interface for the laser release process.

The thin film electronic elements may comprise thin film transistors.

The rigid carrier substrate preferably comprises a glass substrate.

The method can be used for manufacturing an active matrix display device, wherein:

forming thin film electronic elements over the plastic substrate comprises forming an array of pixel circuits over the plastic substrate, and wherein the method further comprises forming a display layer over the array of pixel circuits before releasing the rigid carrier substrate from the plastic substrate.

The invention thus provides a method which enables substantially conventional substrate handling, processing and cell making to be employed in the manufacture of a display. This then enables the manufacturing process for making active matrix displays on plastic substrates to be carried out in standard factories, with only minimal extra equipment needed.

The plastic displays can be made on standard glass substrates, and these can be re-used many times. This invention can be applied for example for LCDs, PLED or OLED displays and electrophoretic displays, and with amorphous silicon (a-Si) or Low Temperature Polycrystalline silicon (LTPS) TFTs.

The process essentially allows the TFTs to be fabricated on plastic layers, interconnects to be made, and some packaging to be carried out while the plastic layer is still stuck to the glass. The release is carried out after the cell formation. This is attractive for all plastic substrate applications, and is a particularly attractive process for making displays on flexible substrates.

The method may further comprise manufacturing a second substrate arrangement, and wherein forming a display layer over the array of pixel circuits comprises mounting the first and second substrate arrangements with electro-optic material (such as LC material) sandwiched therebetween, the active matrix display device thereby comprising first and second substrates with the electro-optic material sandwiched therebetween.

The invention also provides a thin film electronic device, comprising a plastic substrate comprising a transparent plastic material and a UV absorbing additive and thin film electronic elements over the plastic substrate.

BRIEF DESCRIPTION OF THE DRAWINGS

Examples of the invention will now be described in detail with reference to the accompanying drawings, in which.

DESCRIPTION OF EMBODIMENTS

The invention relates generally to the manufacture of thin film electronic devices on plastic substrates, and concerns a process in which laser lift-off of a plastic substrate from a rigid carrier substrate is used. The invention concerns the plastic substrate material.

The invention has particular application to the manufacture of an active matrix display device, and an example of the invention will be described in this context.

Figure 1:
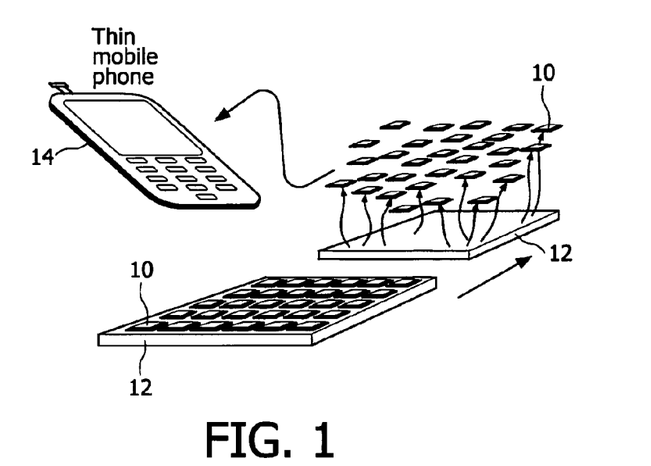
FIG. 1 shows manufactured displays made in accordance with the invention being released from a common glass substrate for use in a mobile phone.

FIG. 1 shows schematically the fabrication of plastic displays in accordance with the invention, and shows the final release stage. Completed displays 10 are released from a glass substrate 12 and are then used in devices such as a mobile phone 14.

One example of the method of the invention will now be described in detail, to show how a display can be made using laser release from a glass substrate, ink jet printing for color filters of the display, and VALC (vacuum aligned LC) for cell making. The example shown in detail is for the manufacture of liquid crystal display cells, having LC material sandwiched between two opposite (active and passive) substrates. The invention can be applied to many other display technologies and to non-display technologies, and the specific example is for illustration only.

Figure 2:
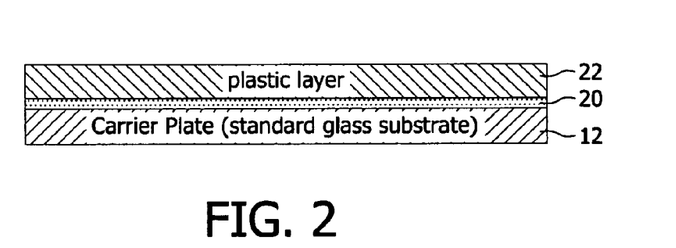
FIG. 2 shows a substrate according to the invention.

FIG. 2 shows a glass carrier plate 12 and a plastic layer 22 which functions as a plastic substrate. The interface between the plastic layer 22 and the carrier plate 12 is shown as 20. A substrate in this form can form the basis of the active plate and the passive plate.

This plastic layer must be strong enough to be one of the walls of the completed cell. In addition, the plastic layer should be transparent and ideally non-birefringent. Furthermore, the plastic layer should be able to absorb laser energy to effect lift-off of the plastic layer from the carrier plate.

The invention concerns the plastic substrate material, and proposes the doping of a transparent plastic substrate, to alter the characteristics and make it suitable for a laser lift-off process.

The substrate material should have a tensile strength of >200 MPa, and be nonbirefringent. It should also be deposited using a wet casting process, for example spin-coating.

The plastic substrate can comprise a polycarbonate, silicone or cellulose triacetate, but is generally chosen as any material which is transparent and which may be wet cast (for example spin coated) from solution to produce a transparent and preferably non-birefringent film.

The spin coating gives an extremely high quality surface and can give an extremely thin layer if required. Most importantly, the plastic is capable of wet casting. The plastic can thus instead be applied by spreading with a blade or printing techniques such as offset litho or silk screen printing. Other processes for coating large areas with a solution may also be used.

By doping the chosen material with UV-absorbing compounds, the lift-off functionality can be introduced. This doping can be provided by mixing the substrate polymer and the additive.

There are rod-like UV-absorbing materials, but the mechanical effect of spin coating can cause these to align laterally, thereby creating a birefringence in the substrate layer after drying. The use of smaller, more spherical dopant molecules, is therefore preferred to avoid this problem.

The UV absorbing additive preferably has an absorption peak within the band 300 nm to 360 nm with absorption coefficient of more than $10^5$ cm$^{-1}$. Furthermore the resulting substrate material should have an absorption length of less than 50 nm so that a surface absorption layer is defined.

Examples of possible UV-absorbing additives to for doping the plastic substrate are:

(i) molecules with a 2-(2-hydroxyphenyl)-trizole unit such as 2-(2H-benzotriazol-2-yl)-4,6-bis(1-methyl-1-phenyl-ethyl)phenol.

This is commercially available under the name Tinuvin 234 from Ciba (Trade Mark) specialty Chemicals).

This is a form of dye which has the required solubility in many polymers, and has an absorption maximum at 302 nm with an extinction coefficient >1.7×10$^4$ l/mol.cm, depending on the polymer in which it is to be dissolved.

(ii) molecules containing conjugatively linked aromatic systems such as Stilbene

Figure 3:
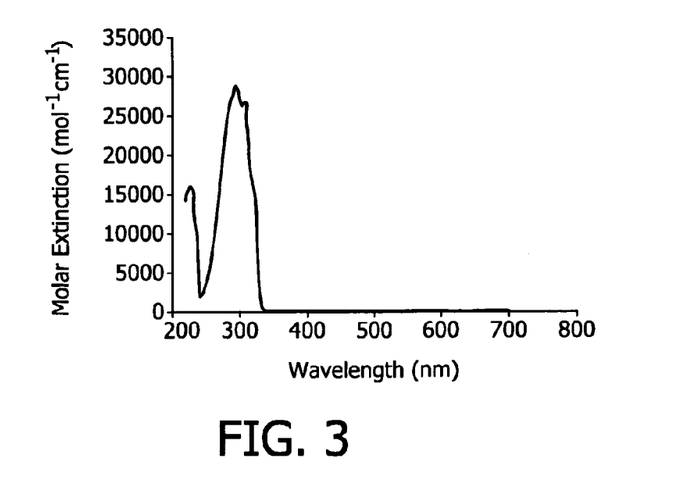
FIGS. 3 to 5 show absorption characteristics for different possible UV absorbers used in the substrate of FIG. 2.

Each molecule contains one or more conjugatively linked electron donating (D) and electron accepting (A) pairs. This reaches an extinction of around $3.10^4$ l/mol.cm at around 300 nm and is still transparent in the visible part of the spectrum. The absorption characteristic is shown in FIG. 3.

(iii) Stilbene with the benzene substituted with electron donating and withdrawing groups.

Figure 4:
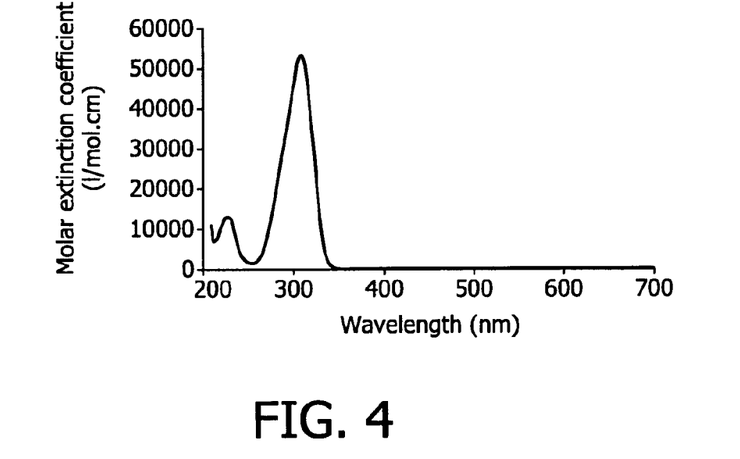

Even higher extinctions can be reached using this type of material. The absorption wavelength may shift towards the visible spectrum with increased extinction:

(iv) Benzene substituted with electron donating and withdrawing groups such as Ethyl-p-dimethylamino benzoate This exhibits the absorption spectrum shown in FIG. 4 in with a high extinction at around 300 nm and the absence of absorption in the visible part of the spectrum.

Figure 5:
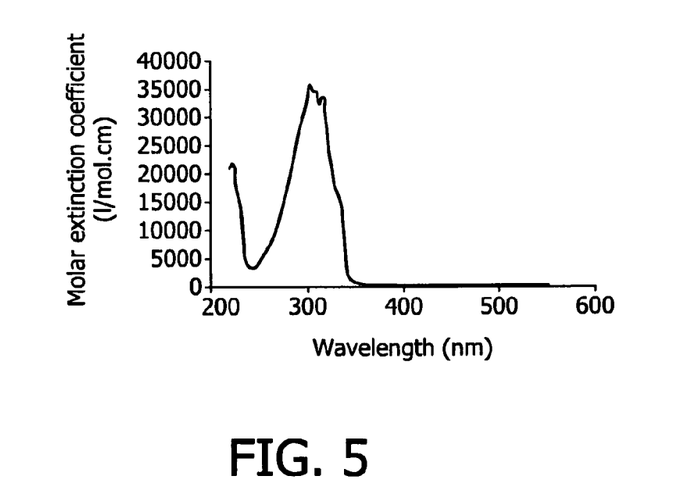

(v) molecules containing conjugatively linked aromatic and heteroaromatic groups such as 2,5-diphenyloxazole This material has the absorption spectrum shown in FIG. 5. After the spin coating process, two methods may be employed to prepare the substrate for the lift-off process.

One is to provide thermal curing and subsequent fixing of the UV absorbing material through the transparent host matrix. The other is to provide UV curing through the glass plate, drawing the absorbers to the polymer/glass interface 20, thereby enhancing the interface absorption. This creates a nearly dual-layer system (as represented schematically in FIG. 2), where the initial UV-absorbing layer has the functionality of causing the lift-off. In this case, there is drift under UV- or thermal-excitation of the UV-absorbing materials to the glass/polymer interface.

The effect is essentially to provide a lift-off layer which can be laser activated to effect separation of the plastic substrate from the carrier plate.

FIGS. 6A to 6M show schematic diagrams for sequential stages of one fabrication scheme. For clarity, these Figures show only one display being made, but in practice there would be many displays on large glass substrates, as shown in FIG. 1.

Figure 6A:
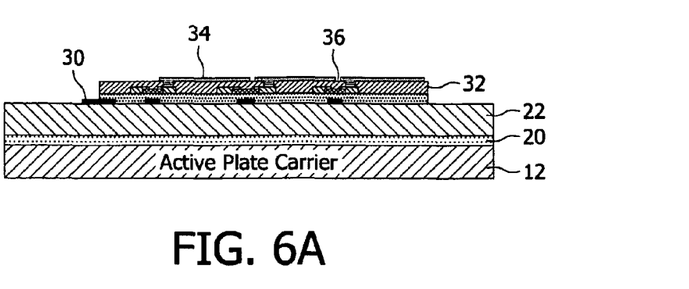
FIGS. 6A to 6M show the processing steps for one example of method of the invention starting with the substrate of FIG. 2.

FIG. 6A shows the active plate, in which a-Si TFT arrays have been made on the plastic surface using (almost) standard processing. The maximum processing temperature will depend upon the plastic layer chosen, but it could be higher than for freestanding plastic films because the plastic is securely anchored to the rigid glass substrate 12 and there are no problems with shrinkage.

The TFT array comprises a gate metal layer 30, a silicon nitride gate dielectric layer 32 and ITO pixel electrodes 34. The TFTs are shows schematically as 36.

Figure 6B:
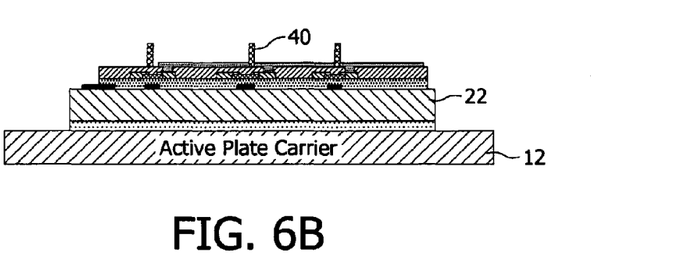

FIG. 6B shows the addition of column spacers 40 for the LC cell. These could either be made by inkjet printing or spinning on a suitable polymer layer and then patterning by photolithography. Dispersed glass or plastic beads or rods could also be used instead, but column spacers that stick to both substrates can give plastic cells increased mechanical strength and help protect the cell from separating.

Figure 6C:
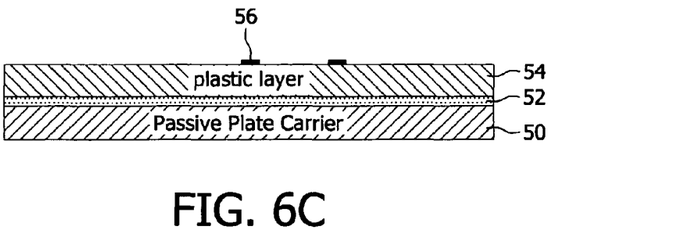

FIG. 6C shows the fabrication of the passive plate substrate. The passive plate also comprises a glass substrate 50, and optional release layer 52 and a plastic substrate 54 (which may be the same plastic as used for the active plate or may be a different plastic). FIG. 6C also shows black mask layers 56. This demonstrates another advantage of fabricating plastic displays in this way, which is that structures can be built into the substrate. The black mask 56 could also be made at a later stage using standard methods.

Figure 6D:
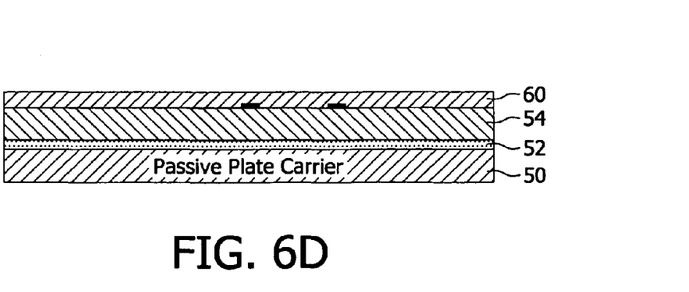

As shown in FIG. 6D, a second polymer layer 60 is added to the passive plate layers. This step is only needed if a buried black mask layer is used.

Figure 6E:
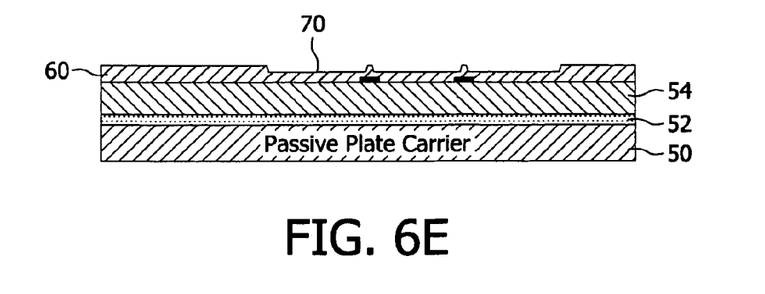

As shown in FIG. 6E, recessed wells 70 are etched into the passive carrier plate. This step is only needed if color filters are to be ink jet printed. These wells serve to define accurately the shape of the color filter pixels. The wells can be etched into the plastic layer either by photolithography and oxygen plasma, laser ablation or by stamping with a hard mask.

Figure 6F:
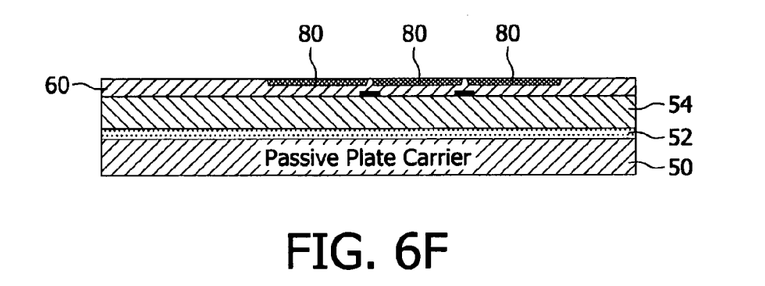

FIG. 6F shows the passive carrier plate after ink jet printing of the color filter layers 80.

Figure 6G:
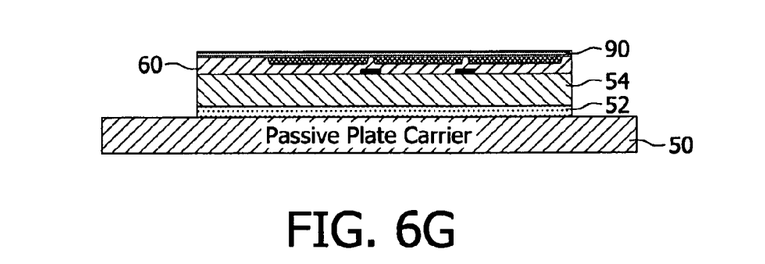

FIG. 6G shows an ITO layer 90 sputtered onto the glass substrate. Furthermore, discrete display devices are formed over the common active plate glass substrate by etching away the ITO, plastic and a-Si release layer.

At this stage, different process routes may be taken, depending on whether traditional cell making is used, or the newer Vacuum Alignment with Liquid Crystal (VALC) method, sometimes called drop filling. In this drop filling method, LC droplets are put onto one of the plates before alignment and plate coupling is carried out under vacuum. By way of example, the following diagrams are for the VALC process.

Figure 6H:
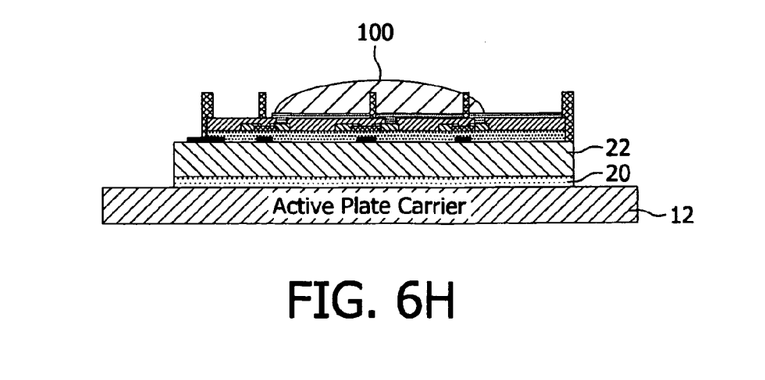

FIG. 6H shows an LC drop 100 put on the active plate area of the plastic display.

Figure 6I:
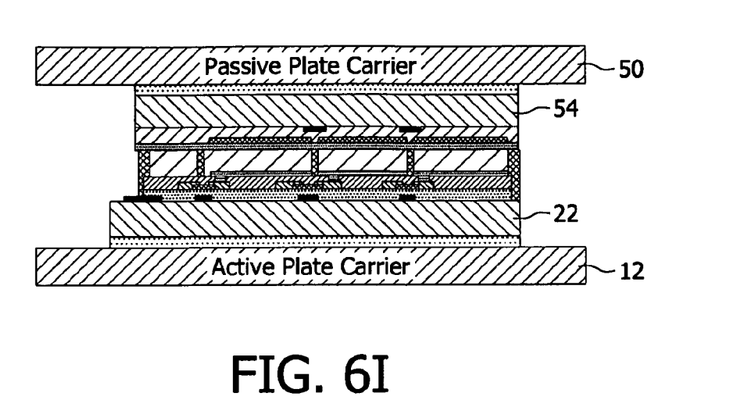

The assembled panel of FIG. 6I is then formed by using the VALC process.

One of the glass plates is then removed from the plastic layer that it is stuck to. This can be done by laser irradiation or lamp heating through the glass of the release layer or bottom of the plastic layer, or by heating the glass plate on a hot plate.

Figure 6J:
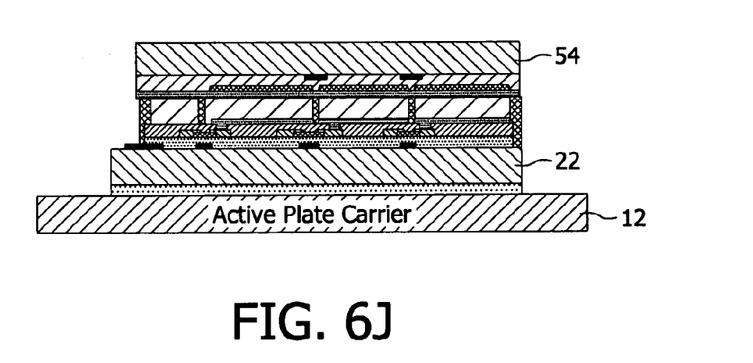

FIG. 6J shows the glass substrate of the passive plate removed, for example by a laser release process. The passive glass carrier plate can then be cleaned to remove all traces of residues from the passive plate process before being re-used.

Figure 6K:
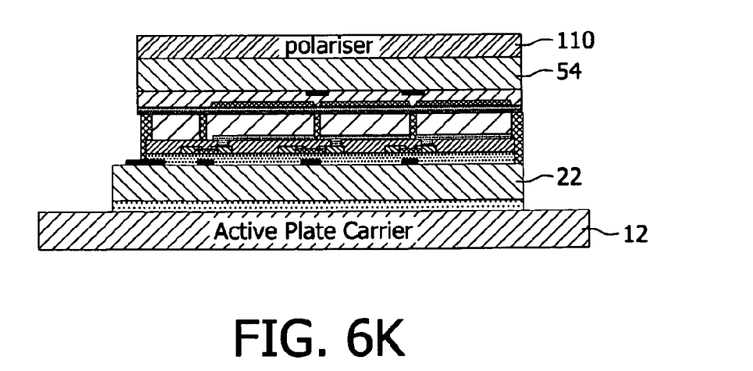

As shown in FIG. 6K, a polarizer 110 is then added. It is easier to do it at this stage before final release of the display because the display still has rigidity due to its coupling to the glass. The polarizer also gives added strength to the top plastic layer. A Chip-on-Glass process can also be done at this stage, or interconnect foils added. The advantage of doing this at this stage is that the plastic sheet is still firmly stuck to the glass, simplifying alignment and fixing.

Figure 6L:
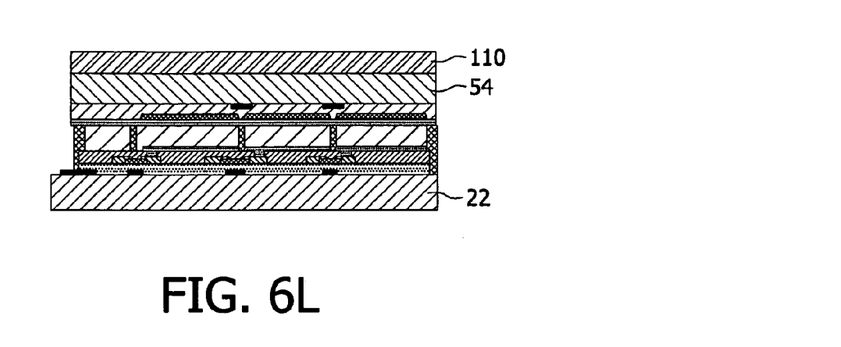

As shown in FIG. 6L, the plastic substrate of the active plate is also released from the active plate glass substrate 12, which can also be cleaned and used again.

Figure 6M:
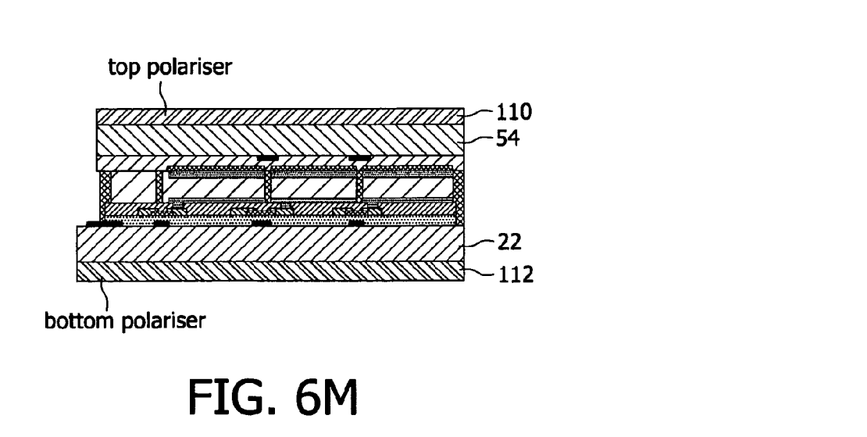

A polarizer film is also applied to the plastic substrate 22 of each active plate. The second polarizer 112 is shown in FIG. 6M, which shows the completed display.

The polarizer must be applied display by display in this case. If VALC is not used, then interconnects are made after formation of the completed cells shown in FIG. 6M.

The plastic substrates are released from the glass substrate by laser release from the plastic that is directly in contact with the glass substrate Laser irradiation (XeCl or 3-omega YAG) can be used through the glass substrate. A thin layer, <1 μm, is photo-ablated leaving freestanding polymer films with good mechanical integrity.

The glass substrate may be cleaned before the wet casting deposition process so that surface contaminants such as oils and ions are removed prior to the coating process. Conventional solvents can be used to perform the cleaning process.

The examples above relate to the manufacture of an active matrix display device. In further aspects, the invention relates more generally to the production of electronic devices comprising thin film circuitry on a plastic substrate. Thus, the invention also comprises applying a plastic coating with the UV-absorbing additive to a rigid carrier substrate using a wet cast process, forming thin film electronic elements over the plastic substrate and then releasing the rigid carrier substrate from the plastic substrate.

This process again enables substantially conventional substrate handling to be used in the processing of a thin film electronic device (for example having TFTs) on a plastic substrate. The use of a wet cast (e.g. spin-on) process gives a flat, high quality surface.

The spin-on process enables very thin substrates to be formed. For example a substrate may be formed with thickness as low as 3 μm.

The examples of manufacturing method described in detail above are in connection with an LCD display. However, it will be apparent to those skilled in the art that there are many variations to each of the steps described.

More generally, the invention provides firstly the application of plastic to a substrate. The thickness of the plastic layers will normally be in the thickness range 2 to 50 μm. This plastic will ultimately become the plastic substrate of the display, for display applications. Suitable wet casting processes are spin coating, printing and spreading.

The substrate can be either a standard glass substrate or a glass substrate coated with a blue-light absorbing layer. The choice depends on the plastic used and laser release properties.

A passivation layer will normally be desired, applied above the plastic layer. Suitable layer types are silicon nitride or silicon oxide deposited by Plasma Enhanced Chemical Vapour deposition (PECVD) or sputtering.

TFT arrays are then be made on the plastic/passivation layer. The TFT array fabrication can be carried out under fairly standard array processing conditions for a-Si or Low Temperature Poly-Si (LTPS). TFTs. There may have to be some small process changes to ensure that the deposited layers do not have high mechanical stress. The use of standard glass substrates coated with very thin layers of plastic and standard TFT array processing means that this process can be used in existing TFT fabrication plants.

TFTs can be used as the active device element for multiplexing several different display types, not only the LCD example above. Whatever the display type is, the display is fabricated while the TFT array is still stuck onto the glass. This means that standard display fabrication tools and techniques can be used and the presence of a thin layer of plastic will not cause any significant differences. The display drivers can also be bonded to the display at this time.

The laser used to remove the plastic substrate from the carrier is applied through the glass substrate to hit the bottom of the plastic. The laser for this purpose will normally have to be scanned to cover the complete area of the display. Pulsed excimer lasers with wavelengths of 308 nm and 351 nm or pulsed 3-omega YAG lasers with a wavelength of 355 nm can be used.

The invention enables direct laser release of a clear plastic substrate, and such a substrate can be used with all display types, including transmissive and transflective LCDs and downward emitting OLEDS and PLEDs.

As mentioned above, a liquid crystal display is only one example of display technology which can benefit from the invention.

Figure 7:
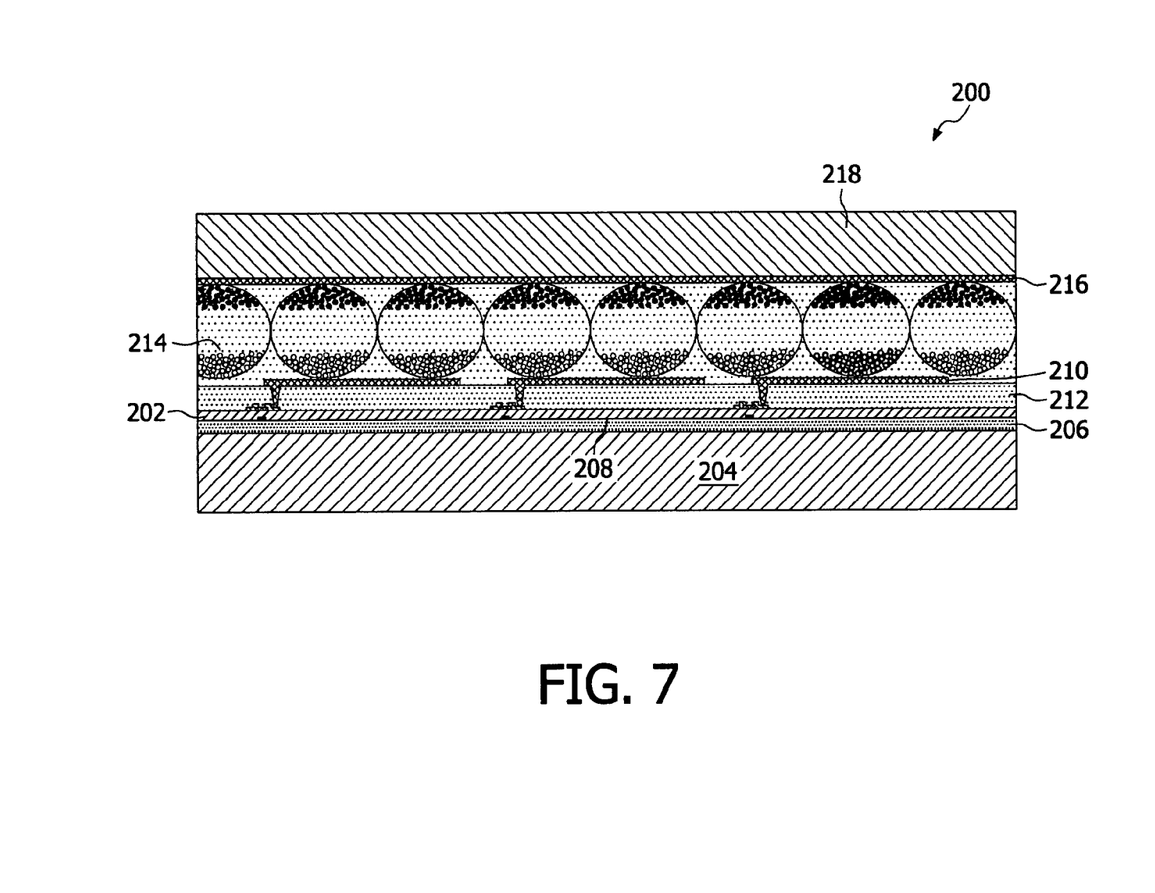
FIG. 7 shows a second example of manufactured display of the invention.

FIG. 7 shows an example reflective display device 200 using electrophoretic display material. An example of this type of display is known as an E-Ink display. An array of thin film transistors 202 is formed on a plastics layer 204 on glass. The TFT array is provided over a silicon nitride passivation layer 206 and a silicon nitride gate insulator layer 208, and the ITO pixels 210 are formed over a polymer passivation layer 212. The glass substrate is not shown in FIG. 7, which shows the final removed display device.

A layer of electrophoretic material comprises capsules 214 and is laminated onto the TFT array. The capsules are responsive to a local electric field across the ink foil layer. This layer is inherently tacky, and is placed on the TFT array and heated, to approximately 100 degrees Celsius, and rolled. The display modules are finished with a ITO layer 216 and a plastic protective layer 218.

Figure 8:
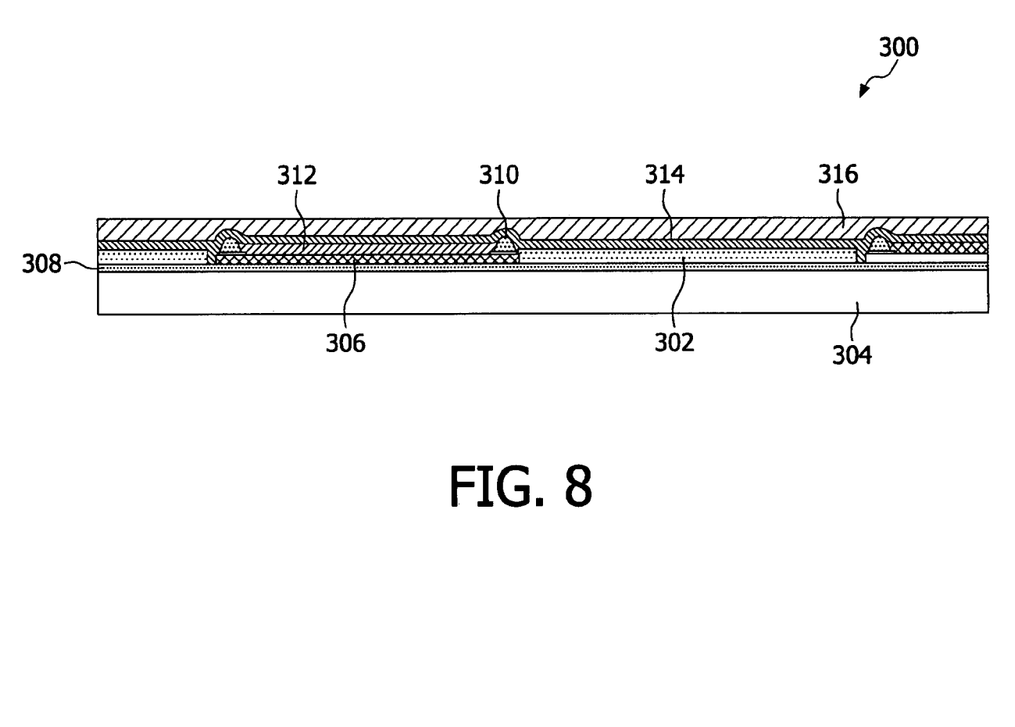
FIG. 8 shows a third example of manufactured display of the invention.

Driver chips mounted onto foils are then connected to lead-in areas, and the laser release step is then carried out. FIG. 8 shows an example polymer LED downwardly emitting display device 300. An array of encapsulated thin film transistor circuits 302 are formed on a clear plastic (such as silicone, BCB or parylene) substrate 304, and with transparent ITO pixel electrodes 306 formed over a silicon nitride passivation layer 308.

A hydrophilic polymer wall 310 surrounds the pixel (although this is not required for organic LEDs) which is defined by the polymer (or organic) LED material 312. A metal cathode 314, such as Ca, covers the structure, and is covered by a polymer passivation layer 316.

The examples of FIGS. 7 and 8 are manufactured in accordance with the invention, and it will be appreciated that numerous other specific display designs, as well as other electronic component designs, can be made using the approach explained above. For example, suitable display types include OLED (organic LED), PLED (polymer LED), EL (electroluminescent) and PDLC (polymer dispersed LC) displays, as well as LCDs.

A number of examples of UV absorber have been given. Generally, the molecule of the UV absorber contains one or more aromatic groups, conjugatively linked, optionally by one or more double bond. Each aromatic group optionally contains one or more hetroatoms selected from N, O and S. Each molecule optionally contains one ore more conjugatively linked electron donating (D) and electron accepting (A) pairs.

Other examples of UV adsorbing molecules are 2-hydroxy-benzophenones, hydroxyphenyl-s-triazines and oxalanilides.

The extinction coefficient of the UV absorber should preferably be greater than $10^4$ and close to $10^5$ if possible, and the additive needs to be soluble in the main substrate material.

The UV absorber should be transparent in the visible spectrum, for example more than 90% transparent in the 400 nm-800 nm wavelength range.

A number of different display technologies have been mentioned, and different materials will be suitable for different technologies. For example for LCDs, it is preferred for the substrate to have as low birefringence as possible, whereas OLEDs do not require nonbirefringent plastic layers. Thus, the need for a non-birefringent material depends on the display technology.

Some preferred examples of plastic material for the substrate have been given above. Typically, high-temperature materials will be of interest as thin film transistors are typically processed at temperatures such as 250 degrees Celsius. To enable this standard TFT processing, the plastic substrates material will be selected to have a glass transition and/or decomposition temperature above 200 degrees Celsius. Other examples are:
(i) Polyethersulfones (PES), polyimides or polyamides.
(ii) Acrylate or methacrylates.

These can be cast coated from solution of the polymers in for instance xylene. Their thermal stability can be improved by crosslinking. In that case, acrylate monomers (low molecular weight or oligomeric), containing a mixture of monofunctional, bifunctional or higher functional monomers, are poured on the rigid substrate and cured in the presence of the dye.
(iii) Cellulose based materials, for example cellulose acetate.

These materials form films easily by cast coating from solution, are non-birefringent but have a limited thermal stability.
(iv) Polyvinylacetate or vinyl acetate/vinyl chloride copolymers.

These materials also form films easily by cast coating from solution, are non-birefringent but again have a limited thermal stability.

A two layer system may also be used, for example in the case of crosslinked materials. A first very thin layer near the rigid substrate can contain a high concentration of the dye. A second layer on top of this can be formed from the same polymer, but without the dye. The advantage of such a multi layer structure is that higher dye concentrations can be used near the interface.

It may also be possible to use low temperature substrate materials if the subsequent thin film processing can be carried out at lower temperature. In this case the examples (iii) and (iv) above become more suitable, as well as polyethylenes (like polyethylene terephthalate (PET), or polyethylene naphthalate (PEN)), cyclic olefins, polyarylates, benzocyclobutanes, and others, could also be used.

This list is not complete and other substrate materials will be apparent to those skilled in the art. Polyesters may be suitable for some applications (often these are birefringent), polystyrenes (often these are brittle), polyoxides (some particular examples may be particularly suitable such as poly(2,6-dimethyl-1,4-phenylene oxide (PPO)).

The plastic substrate is described above as transparent, but it should be understood that there will be some light absorption, and the degree of transparency must be sufficient for the device to perform the desired function of the end product.

The tensile modulus of the transparent substrate should preferably be greater than 100 MPa and more preferably greater than 200 MPa.

Examples of preferred substrate material are polycarbonates and polymethacrylates.

Various other modifications will be apparent to those skilled in the art.

The invention claimed is:

1. A method of manufacturing a thin film electronic device, the method comprising the acts of:
   applying a plastic coating to a rigid carrier substrate using a wet casting process, the plastic coating forming a plastic substrate and comprising a transparent plastic material doped with a UV absorbing additive;
   curing the plastic coating thereby drawing the UV absorbing additive to an interface between the rigid carrier and the plastic coating and enhance UV energy absorption at the interface;
   after the curing act, forming thin film electronic elements over the plastic substrate; and
   releasing the rigid carrier substrate from the plastic substrate,
   wherein the transparent plastic material is non-birefringent, and wherein the UV absorbing additive comprises dopant molecules that are more spherical than rod-like molecules to avoid creating a birefringence in the plastic substrate.

2. The method of claim 1, wherein the UV absorbing additive comprises:
   2-(2H-benzotriazol-2-yl)-4,6-bis(1-methyl-1-phenylethyl)phenol.

3. The method of claim 2, wherein the UV absorbing additive further comprises: stilbene.

4. The method of claim 2, wherein the UV absorbing additive further comprises: stilbene substituted with electron donating and withdrawing groups.

5. The method of claim 2, wherein the UV absorbing additive further comprises: ethyl-p-dimethylamino benzoate.

6. The method of claim 2, wherein the UV absorbing additive further comprises: 2,5-diphenyloxazole.

7. The method of claim 1, wherein the UV absorbing additive comprises stilbene.

8. The method of claim 1, wherein the UV absorbing additive comprises stilbene substituted with electron donating and withdrawing groups.

9. The method of claim 1, wherein the UV absorbing additive comprises:
ethyl-p-dimethylamino benzoate.

10. The method of claim 1, wherein the UV absorbing additive comprises:
2,5-diphenyloxazole.

11. The method of claim 1, wherein the plastic material comprises polycarbonate.

12. The method of claim 11, wherein the plastic material further comprises silicone.

13. The method of claim 1, wherein the plastic material comprises a silicone.

14. The method of claim 1, further comprising the act of UV curing of the plastic coating thereby to draw the UV absorbing additive to the boundary between the rigid carrier and the plastic coating, before forming thin film electronic elements.

15. The method of claim 1, wherein the thin film electronic elements comprise thin film transistors.

16. The method of claim 1, wherein the rigid carrier substrate comprises a glass substrate.

17. The method of claim 1, wherein the release is by a laser process.

18. The method of claim 1, wherein the UV absorbing additive has an absorption peak within the band 300 nm to 360 nm of absorption coefficient more than 104 $cm^{-1}$.

19. The method of claim 1, further comprising the acts of:
forming a further rigid carrier substrate, and
display forming a display layer over the thin film electronic elements, wherein the display forming act includes the act of mounting the rigid carrier substrate and the further rigid carrier substrate with electro-optic material sandwiched therebetween to form an active matrix display device.

20. The method of claim 19, wherein the wet casting process is by spin coating, and the thin film electronic elements further comprise thin film transistors, and the rigid carrier substrate is a glass substrate, and the release is by a laser process.

21. The method of claim 20, wherein the UV absorbing additive comprises: stilbene.

22. The method of claim 20, wherein the UV absorbing additive comprises: stilbene substituted with electron donating and withdrawing groups.

23. The method of claim 20, wherein the UV absorbing additive comprises: ethyl-p-dimethylamino benzoate.

24. The method of claim 20, wherein the UV absorbing additive comprises: 2,5-diphenyloxazole.

25. The method of claim 20, wherein the plastic material comprises silicone.

26. The method of claim 20, further comprising UV curing of the plastic coating.

27. The method of claim 1, wherein the wet casting process comprises a spin-on process.

28. A product of the process of claim 1, comprising a plastic coating substrate comprising a transparent plastic material and a UV absorbing additive and thin film electronic elements over the plastic substrate.

29. The product of claim 28, wherein the UV absorbing additive comprises:
2-(2H-benzotriazol-2-yl)-4,6-bis(1-methyl-1-phenylethyl)phenol.

30. The product of claim 28, wherein the UV absorbing additive comprises stilbene.

31. The product of claim 28, wherein the UV absorbing additive comprises stilbene substituted with electron donating and withdrawing groups.

32. The product of claim 28, wherein the UV absorbing additive comprises:
ethyl-p-dimethylamino benzoate.

33. The product of claim 28, wherein the UV absorbing additive comprises:
2,5-diphenyloxazole.

34. The product of claim 28, wherein the plastic material is non-birefringent.

35. The product of claim 28, wherein the plastic material comprises polycarbonate.

36. The product of claim 28, wherein the plastic material comprises a silicone.

37. The product of claim 28, wherein the UV absorbing additive has an absorption peak within the band 300 nm to 360 nm of absorption coefficient more than 104 $cm^{-1}$.

38. The product of claim 28, wherein the thin film electronic elements comprise thin film transistors.

39. The product of claim 28, further comprising:
a further rigid carrier substrate, and
a display layer formed over the thin film electronic elements, wherein the display layer comprises the first rigid carrier substrate and the further rigid carrier substrate mounted with electro-optic material sandwiched therebetween to form an active matrix display device.

40. The method of claim 1, further comprising substantial UV curing of the plastic coating.

* * * * *